United States Patent
Jung et al.

(10) Patent No.: US 6,960,425 B2
(45) Date of Patent: Nov. 1, 2005

(54) METHOD FOR LAMINATING AND PATTERNING CARBON NANOTUBES USING CHEMICAL SELF-ASSEMBLY PROCESS

(75) Inventors: Myung Sup Jung, Daejeon-shi (KR); Jong Jin Park, Guri-shi (KR); Sung Ouk Jung, Suwon-shi (KR); Seung Joo Seo, Yongin-shi (KR); Bon Won Koo, Suwon-shi (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/693,647

(22) Filed: Oct. 27, 2003

(65) Prior Publication Data

US 2004/0142285 A1 Jul. 22, 2004

(30) Foreign Application Priority Data

Oct. 26, 2002 (KR) .............................. 10-2002-0065647
Jun. 21, 2003 (KR) .............................. 10-2003-0040461

(51) Int. Cl.$^7$ ............................................. G03F 7/30
(52) U.S. Cl. ....................... 430/323; 430/166; 430/326; 430/327
(58) Field of Search ............................. 430/323, 326, 430/327, 166

(56) References Cited

U.S. PATENT DOCUMENTS

| 6,426,134 B1 | * | 7/2002 | Lavin et al. | 428/300.1 |
| 2004/0173818 A1 | * | 9/2004 | Cheng | 257/200 |
| 2004/0228961 A1 | * | 11/2004 | Cheng | 257/200 |
| 2004/0241896 A1 | * | 12/2004 | Zhou et al. | 438/48 |

FOREIGN PATENT DOCUMENTS

| EP | 1422563 A1 | * | 5/2004 | G03F/7/027 |
| EP | 1457821 A1 | * | 9/2004 | G03F/7/038 |

OTHER PUBLICATIONS

Liu et al. Organizing Single–Walled Carbon Nanotubes on Gold Using Self–Assembling Technique, American Chem. Society, 2000, pp. 3569–3573.
Liu et al. Controlled Deposition of Individual Single–Walled Carbon Nanotubes on Chemically Functionalized Templates, Chem. Physics Ltrs., 1999, pp. 125–129.
Shimoda et al Self–Assembly of Carbon Nanotubes, Adv. Mater, 2002, pp. 899–901.
Diao, et al. Chemically Assembled Single–Wall Carbon Nanotubes, Chemphyschem 2002, pp. 898–901.

* cited by examiner

*Primary Examiner*—John S. Chu
(74) *Attorney, Agent, or Firm*—Lee, Sterba & Morse, P.C.

(57) ABSTRACT

A method for forming a pattern of carbon nanotubes includes forming a pattern on a surface-treated substrate using a photolithographic process, and laminating carbon nanotubes thereon using a chemical self-assembly process so as to form the carbon nanotubes in a monolayer or multilayer structure. A monolayer or multilayer carbon nanotube pattern may be easily formed on the substrate, e.g., glass, a silicon wafer and a plastic. Accordingly, the method can be applied to form patterned carbon nanotube layers having a high conductivity, and thus will be usefully utilized in the manufacturing processes of energy storages, for example, solar cells and batteries, flat panel displays, transistors, chemical and biological sensors, semiconductor devices and the like.

21 Claims, 3 Drawing Sheets

(a)

METHOD FOR LAMINATING AND PATTERNING CARBON NANOTUBES USING CHEMICAL SELF-ASSEMBLY PROCESS

BACKGROUND OF THE INVENTION

1. Field of the Invention

The present invention relates to a method for laminating and patterning carbon nanotubes using a chemical self-assembly process, and more particularly to a method for forming a pattern of carbon nanotubes, comprising forming a pattern on a surface-treated substrate using a photolithographic process, and laminating carbon nanotubes thereon using a chemical self-assembly process so as to form the carbon nanotubes in a monolayer or multilayer structure.

2. Description of the Related Art

Since carbon nanotubes were first discovered in 1991 by Dr. Iijima of Meijo University in Japan, who engaged in developing electron microscopes, many studies on carbon nanotubes have been undertaken. Carbon nanotubes have such a structure that a graphite plate is rolled into a tube of which the diameter is typically within the range of 1 to 20 nm. Graphite is very unique in the arrangement of carbon atoms and has a strong and flat, plate-like structure in hexagonal shape. The top and bottom portions of the graphite plate are filled up with free electrons which move parallel along a plane of the plate in a discrete state. Because the graphite plate is helically rolled to form a carbon nanotube, bonding of edges occurs at different points. Changing the spirality or chirality of the carbon nanotube leads to the movement manner of the free electrons. Accordingly, the free electrons behave freely and exhibit a reactivity as high as metal. Otherwise, the nanotube should overcome a bandgap like a semiconductor. The bandgap is determined according to the diameter of the carbon nanotube. Even in the case of a carbon nanotube at the smallest diameter, the bandgap amounts to 1 eV. In view of the foregoing, the carbon nanotube has a superior mechanical strength and chemical stability, and further can exhibit conducting or semiconducting properties. Accordingly, it can be applied to a material of flat panel displays, transistors, energy storage devices, etc., and further has broader industrial applicability in the field of various nano-scale electronic devices.

Conventional methods for arranging carbon nanotubes on a substrate are limited to a monolayer structure of carbon nanotubes, and thus the surface density of carbon nanotubes is low. For this reason, a sufficient electrical conductivity on the surface of carbon nanotubes cannot be anticipated. In addition, because conventional patterning methods depend on simple adsorption of carbon nanotubes, adhesion between the carbon nanotubes and a substrate is poor, and the stability of the pattern is low. Moreover, there exist problems of complex patterning processes and low productivity associated with conventional methods for arranging carbon nanotubes on a substrate. For these reasons, mass-production of patterned carbon nanotubes using conventional methods is difficult and impracticable.

SUMMARY OF THE INVENTION

It is a feature of the present invention to provide a simple method of producing a carbon nanotube pattern by forming an amine pattern using a photolithographic process, followed by selectively bonding carbon nanotubes to a desired region.

It is another feature of the present invention to provide a high-density carbon nanotube pattern in a multilayer structure by repeatedly performing the forming a diamine monolayer on the carbon nanotube pattern using a chemical self-assembly process, and reacting the diamine monolayer with additional carbon nanotubes.

It is another feature of the present invention to provide a carbon nanotube layer having excellent surface adhesion by bonding carbon nanotubes to a substrate surface in the presence of a certain coupling agent.

It is yet another feature of the present invention to provide a high-density carbon nanotube multilayer by repeatedly performing the forming a diamine monolayer on the carbon nanotube layer using a chemical self-assembly process, and reacting the diamine monolayer with additional carbon nanotubes.

In accordance with one aspect of the present invention, there is provided a method for forming a carbon nanotube pattern comprising:

(a) surface treating a substrate to expose amino groups thereon;

(b) treating the surface-treated substrate with a linker of aminoalkylcarboxylic acid represented by the following formula 1:

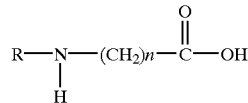

Formula 1 wherein R is a functional group capable of being dissociated by an acid, and n is an integer of 1 to 50, in the presence of a coupling agent to form amide bonds between the amino groups exposed on the substrate and the carboxyl groups of the aminoalkylcarboxylic acid;

(c) applying a photo-acid generator onto the substrate, irradiating UV light to the substrate through a patterned photomask, and developing with an alkaline developer to form a positive pattern on which reactive amino groups are exposed; and (d) reacting the reactive amino groups on the substrate with carboxylated carbon nanotubes in the presence of a coupling agent to form a carbon nanotube layer.

In accordance with another aspect of the present invention, there is provided the above method for forming a carbon nanotube pattern, wherein after (d), (e) and (f) are performed one or more times to form a carbon nanotube pattern in multilayer structure:

(e) reacting terminal carboxylic groups of the carbon nanotube pattern formed on the substrate, with an organic diamine compound, to form a diamine monolayer on the carbon nanotube pattern; and (f) reacting the diamine monolayer with additional carboxylated carbon nanotubes in the presence of a coupling agent, to form a carbon nanotube layer.

In accordance with another aspect of the present invention, there is provided a method for forming a carbon nanotube layer comprising:

(a) surface treating a substrate to expose amino groups thereon; and (b) reacting the amino groups of the substrate with carboxylated carbon nanotubes in the presence of a coupling agent and a catalyst to form a carbon nanotube layer, wherein the coupling agent is O-(7-azabenzotriazol-1-yl)-N,N,N',N'-tetramethyluronium hexafluorophosphate and the catalyst is alkyl or aryl amine.

In accordance with yet another aspect of the present invention, there is provided the above method for forming a carbon nanotube layer, wherein after (b), (c) and (d) are performed one or more times to form a carbon nanotube multilayer:

(c) reacting terminal carboxylic groups of the carbon nanotube layer formed on the substrate, with an organic diamine compound, to form a diamine monolayer on the carbon nanotube layer, and (d) reacting the diamine monolayer with additional carboxylated carbon nanotubes in the presence of a coupling agent, to form a carbon nanotube layer.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
FIG. 1 is a scanning electron microscope (SEM) image of a substrate surface on which carbon nanotubes have been laminated once, in accordance with Example 4 of the present invention.
Figure 2:
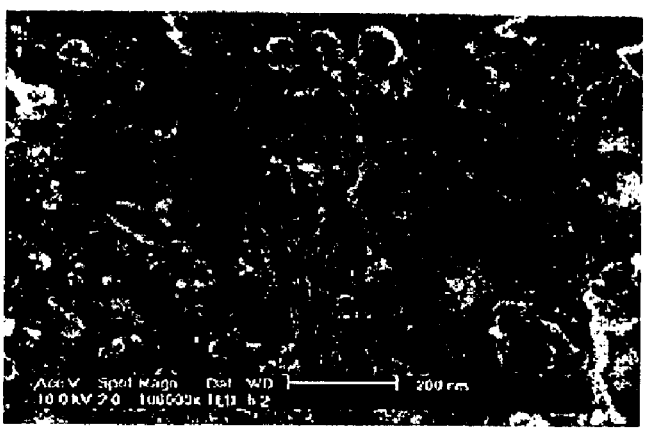
FIG. 2 is a SEM image of a substrate surface on which carbon nanotubes had been laminated twice, in accordance with Example 4 of the present invention.
Figure 3:
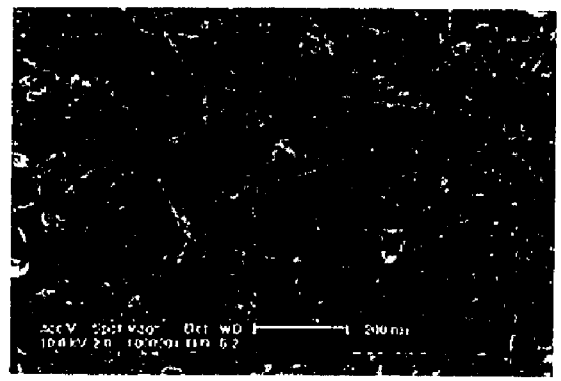
FIG. 3 is a SEM image of a substrate surface on which carbon nanotubes had been laminated three times, in accordance with Example 4 of the present invention.
Figure 4:
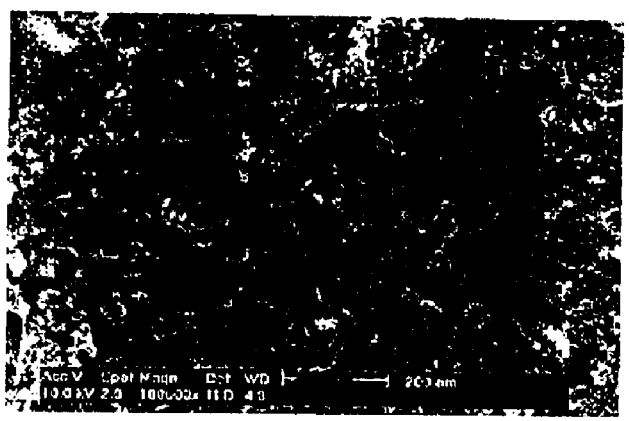
FIG. 4 is a SEM image of a substrate surface on which carbon nanotubes had been laminated six times, in accordance with Example 4 of the present invention.
Figure 5:
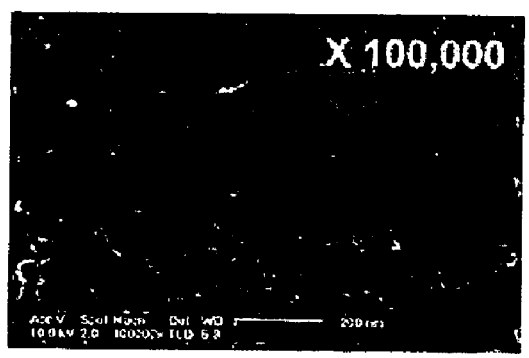
FIG. 5 is a SEM image of a substrate surface on which carbon nanotubes had been laminated nine times, in accordance with Example 4 of the present invention.

Korean Patent Application Nos. 2002-65647 and 2003-40461, filed Oct. 26, 2002 and Jun. 21, 2003, respectively, an entitled "METHODS OF LAMINATING AND PATTERNING CARBON NANOTUBES USING CHEMICAL SELF-ASSEMBLY PROCESS," are incorporated by reference herein in their entirety.

In a first embodiment of the present invention, there is provided a method for preparing a carbon nanotube pattern by forming a positive pattern on a substrate using a photolithographic process, and reacting carboxylated carbon nanotubes thereto in the presence of a coupling agent. The method according to the first embodiment will now be explained in more detail.

Surface Treatment of Substrate

Examples of the substrate material usable in the present invention include, but are not limited to, glass, silicon wafers, plastics, etc.

The surface of the substrate is treated with aminoalkylalkoxysilane and aminoarylalkoxysilane compounds, etc., so that amino groups of these compounds are exposed on the surface of the substrate. As a material for treating the substrate surface, an aminopropylalkoxysilane or aminophenylalkoxysilane compound is preferred, and an aminopropyltriethoxysilane compound is more preferred.

The surface treatment of the substrate may be carried out by coating the surface-treating material onto the surface of the substrate using a spin coating, a dip coating, a spray coating, a flow coating or a screen printing process, and thereafter drying the substrate under vacuum or inert atmosphere at 10 to 150° C. More preferably, a dip coating is used.

Introducing Linker onto Substrate

The amino groups exposed on the substrate are bonded to carboxyl groups of a linker having an appropriate number of carbon atoms in the presence of a coupling agent to form amide bonds. As the linker, an aminoalkylcarboxylic acid of which the amino group is protected with an acid-labile group is used. The aminoalkycarboxylic acid is represented by the following formula 1:

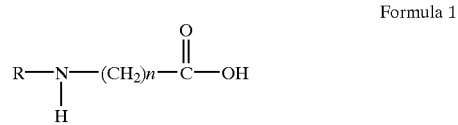

Formula 1 wherein R is an acid-labile group, and n is an integer of 1 to 50.

Examples of the group R include, but is not limited to, t-butoxycarbonyl group, trimethylsilyloxycarbonyl group, and —$CHR_1$—O—$R_2$, in which $R_1$ is a hydrogen, a saturated or unsaturated hydrocarbon group having from 1 to 20 carbon atoms, or an organic aromatic group having from 1 to 20 carbon atoms, and $R_2$ is a saturated or unsaturated hydrocarbon group having from 1 to 20 carbon atoms, or an organic aromatic group having from 1 to 20 carbon atoms, and $R_1$ and $R_2$ are capable of being bonded to each other to form a cyclic compound.

Preferred examples of the group R include those represented by the following formula 2:

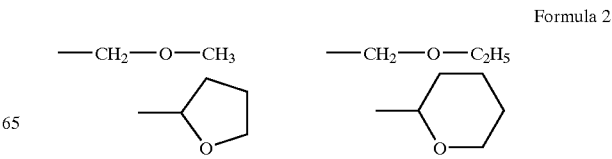

Formula 2

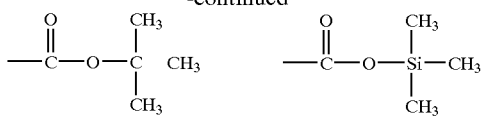

The coupling agent which is added when attaching the linker to the substrate, is specifically at least one compound selected from the group consisting of 1,3-dicyclohexylcarbodiimide, 1-ethyl-3(3-dimethylaminopropyl)-carbodiimide, benzotriazol-1-yloxytris(dimethylamino)phosphonium hexafluorophosphate and O-(7-azabenzotriazol-1-yl)-N,N,N',N'-tetramethyluronium hexafluorophosphate. Among these compounds, O-(7-azabenzotriazol-1-yl)-N,N,N',N'-tetramethyluronium hexafluorophosphate is particularly preferred.

For further promoting the attachment of the linker to the substrate (coupling reaction), an alkyl or aryl amine compound, can be used together with the coupling agent as a catalyst. Preferably, N,N-diisopropylethylamine is used.

The attachment of the linker to the substrate is carried out, for example, by immersing a surface-treated substrate in a solution dissolving the linker in 1 to 500 mM and the coupling agent in 1 to 500 mM, and stirring the solution at 10 to 100° C. for a sufficient time, preferably 0.5 to 15 hours. As the solvent, N-methyl-2-pyrrolidone (NMP), dimethylacetamide (DMAc), dimethylformamide (DMF), cyclohexanone, etc., can be used, but the present invention is not limited to this range.

Formation of Pattern by Photolithographic Process

A photo-acid generator is applied onto the surface of the substrate to which the acid-labile groups are attached. The substrate is then subjected to a pre-baking process to evaporate the solvent and to form a layer on the substrate. UV light is irradiated onto the substrate through a patterned photomask. The exposure energy is preferably about 50 to 1000 mJ/cm$^2$. After exposure, a post-exposure baking process is carried out at about 100° C. for about 30 to 300 seconds. By these processes, photo-acid is generated in an exposed region and the protecting groups are separated from the linker. When developing with an alkaline developer, the photo-acid generator and the acid-labile groups in the exposed region are removed to form a desired pattern on the substrate. After developing, the formed pattern is cleaned with distilled water or an organic solvent, and dried to obtain a positive pattern on which reactive amino groups are exposed.

Examples of photo-acid generators used during formation of the pattern include, but is not limited to, ionic photo-acid generators such as $Ph_2I^+AsF_6^-$, $Ph_2I^+PF_6^-$, $Ph_2I^+TosO^-$, $Ph_3S^+SbF_6^-$, $Ph_3S^+TosO^-$, $Ph_3S^+TfO^-$, $RO-C_6H_4-N_2^+SbF_6^-$ and diphenyl iodonium salts of an aromatic sulfonic acid having a hydroxyl group, represented by the following formula 3:

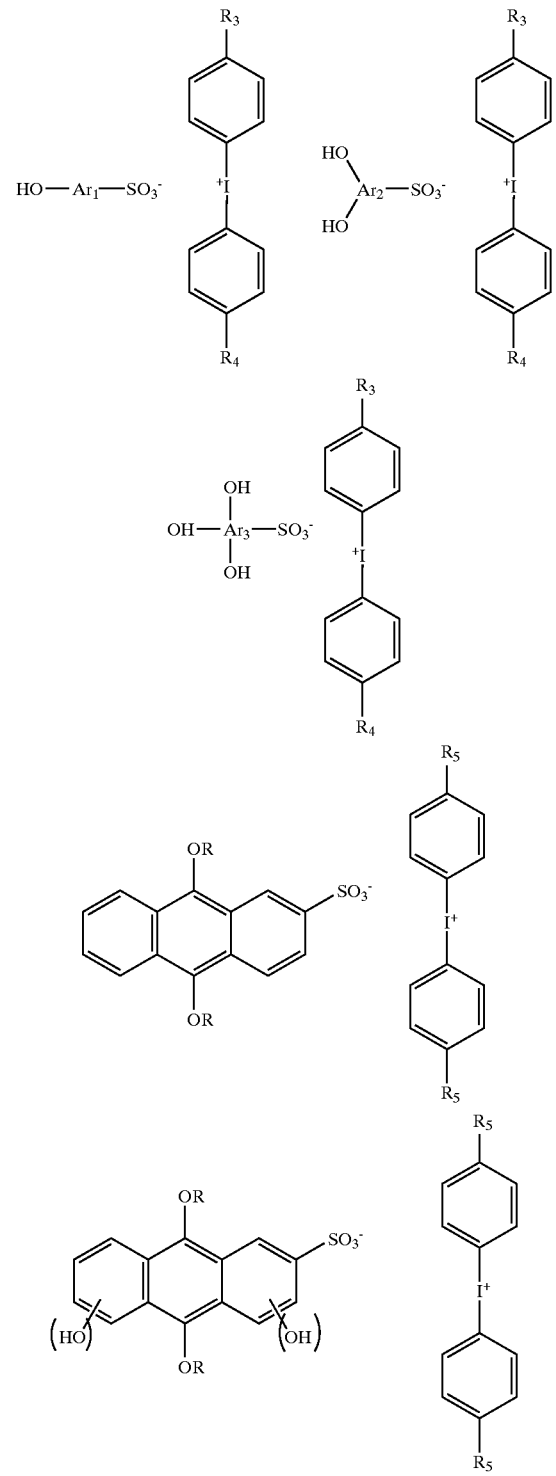

Formula 3 wherein $R_3$, $R_4$ and $R_5$ are each independently an alkyl group, an alkoxy group or a hydroxyl group, and $Ar_1$, $Ar_2$ and $Ar_3$ are each independently a phenyl group, a naphthalenyl group or an anthracenyl group.

Further examples of photo-acid generators used during formation of the pattern include, but is not limited to, non-ionic photo-acid generators such as DNQ (diazonaphthoquinone) compounds represented by the following formula 4:

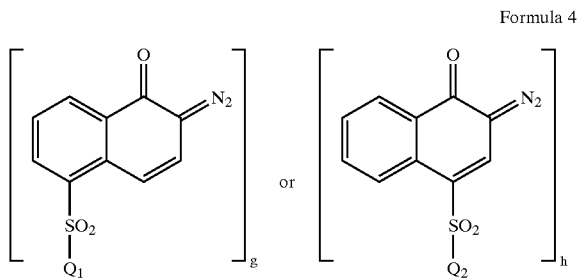

Formula 4 wherein $Q_1$ and $Q_2$ are each independently a monovalent or higher alkyl group or aryl group, and g and h are each independently an integer of at least 1, and nitrobenzylsulfonic acids represented by the following formula 5:

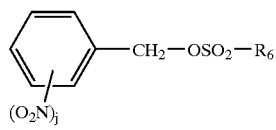

Formula 5 wherein $R_6$ is an alkyl group or aryl group which may contain at least one heteroatom, and j is an integer of 1 to 3; and polymeric photo-acid generators.

The polymeric photo-acid generators are polymers having a molecular weight of 500 to 1,000,000, and contain sulfonium or iodonium salts in their main chain or side chains or organic photo-acid generating groups in their side chains, whereby a photo-acid is generated when irradiated.

In the present invention, the photo-acid generators may be used either alone or in combination.

In the developing process, the alkaline developer is preferred because it is economical and environmentally friendly compared to organic solvents. Preferred examples of the alkaline developer include, but is not limited to, aqueous quaternary ammonium hydroxide solutions such as tetramethylammonium hydroxide (TMAH), and aqueous amine-based solutions, such as ethanolamine. Among them, an aqueous TMAH solution (2.38%) is most widely used.

Lamination of Carbon Nanotubes

The positive pattern of reactive amine groups formed on the substrate is reacted with carboxylated carbon nanotubes in the presence of the coupling agent, to form a patterned carbon nanotube monolayer on the substrate.

The carbon nanotubes used herein are not particularly limited, insofar as they do not detract from the features of the present invention. For example, commercially available products may be used. Also, the carbon nanotubes are not limited by their production process such as arc discharge, laser ablation, hot-filament plasma chemical vapor deposition, microwave plasma chemical vapor deposition, thermochemical vapor deposition, pyrosis processes, etc.

Since the carbon nanotubes fabricated by any one of these processes include impurities, for example, carbon-containing materials such as amorphous carbons, fullerenes, graphite, etc., and transition metals such as nickel (Ni), iron (Fe), etc., used as catalysts for carbon nanotube growth, additional processes are required to remove the impurities. For example, after the carbon nanotubes are refluxed in an $HNO_3$ aqueous solution (2 to 3M) for about 48 hours, the resulting mixture is centrifuged at about 2000 rpm for about 30 minutes to separate precipitates and a supernatant of acid solution. The supernatant is removed, and the precipitates are dispersed in distilled water, centrifuged, and separated from a supernatant. These series of processes are repeated three or more times. Then the finally obtained precipitates are dispersed in an aqueous solution containing a surfactant and the dispersion is adjusted to a pH of 10 or higher using sodium hydroxide (NaOH). After the resulting mixture is subjected to a sonication process for about 10 hours, an excess of hydrochloric acid (HCl) is added to precipitate single wall carbon nanotubes (SWNT). Subsequently, the solution is centrifuged to remove an aqueous acid solution from the precipitated slurry. The slurry is passed through a membrane filter with a pore size of 1 μm to obtain purified single wall carbon nanotubes. In addition to the process discussed above, the carbon nanotubes can be purified by any known process.

In order to apply the carbon nanotubes purified in the above to the method of the present invention, the carbon nanotubes should be chemically cut and carboxylated on the surface and both ends of the carbon nanotubes. As an example of cutting the carbon nanotubes, the carbon nanotubes are sonicated in an acidic mixture of sulfuric acid and nitric acid (3:1 ratio) for about 24 hours to chemically oxidize them, and then centrifuged. In addition to the process discussed above, the carbon nanotubes can be cut by previously known processes.

The coupling agent for bonding the carboxylated carbon nanotubes to the reactive amino groups exposed on the substrate is at least one compound selected from the group consisting of 1,3-dicyclohexylcarbodiimide, 1-ethyl-3-(3-dimethylaminopropyl)-carbodiimide, benzotriazol-1-yloxytris(dimethylamino) phosphonium hexafluorophosphate and O-(7-azabenzotriazol-1-yl)-N,N,N',N'-tetramethyluronium hexafluorophosphate. Among these compounds, O-(7-azabenzotriazol-1-yl)-N,N,N',N'-tetramethyluronium hexafluorophosphate is particularly preferred.

For promoting the coupling reaction, an alkyl or aryl amine compound can be used together with the coupling agent. Preferably, N,N-diisopropylethylamine is used.

The reaction of the carboxylated carbon nanotubes with the reactive amino groups exposed on the substrate is carried out, for example, by mixing the coupling agent (1 to 500 mM) with a dispersion liquid containing 0.00001 to 1% by weight of the carboxylated carbon nanotubes, immersing the substrate in the mixture, continuing a reaction at 10 to 100° C. for 0.5 to 15 hours, and washing the substrate. Examples of the solvent which may be used in this process include, but is not limited to, N-methyl-2-pyrrolidone (NMP), dimethylacetamide (DMAc), dimethylformamide (DMF), cyclohexanone, etc.

In a second embodiment, there is provided a method for forming a high-density carbon nanotube pattern in a multi-layer structure on the carbon nanotube pattern prepared by the first embodiment. The method according to the second embodiment will now be explained in further detail.

Formation of Organic Monolayer of Amine Compound

First, a diamine compound is reacted with the carbon nanotube pattern formed in the first embodiment, to laminate an organic monolayer of the diamine compound on the surface of the carbon nanotube layer. This lamination converts carboxyl groups on the surface of the carbon nanotube layer to amino groups.

Examples of the diamine compounds include, but is not limited to, aromatic diamine compounds such as 1,3-diamino-4-dihydroxybenzene, 1,3-diamino-5-dihydroxybenzene, 3,3'-diamino-4,4'-dihydroxybiphenyl, 4,4'-diamino-3,3'-dihydroxybiphenyl, 2,2-bis(3-amino-4-hydroxyphenyl)propane, bis(4-amino-3-hydroxyphenyl) sulfone, bis(3-amino-4-hydroxyphenyl)sulfone, bis(3-amino-4-hydroxyphenyl)ether, bis(4-amino-3-hydroxyphenyl)ether, 2,2-bis(3-amino-4-hydroxyphenyl) hexafluoropropane, 2,2-bis(4-amino-3-hydroxyphenyl) hexafluoropropane, m-phenylenediamine, p-phenylenediamine, 4,4'-diaminediphenylmethane, 4,4'-diaminediphenylether, 2,2'-bis(4-aminophenyl) propane, 4,4'-diaminophenylsulfone, 3,3'-4,4'-diaminodiphenylsulfone, 4,4'-diaminodiphenylsulfone, 1,4-bis(3-aminophenoxy)benzene, 1,4-bis(4-aminophenoxy)benzene, 1,4-bis(p-aminophenylsulfonyl)benzene, 1,4-bis(m-aminophenylsulfonyl)benzene, 2,2-bis[4-(4-aminophenoxy)phenyl]propane, bis[4-(4-aminophenoxy)phenyl]methane, bis[3,5-dimethyl-4-(4-aminophenoxy)phenyl]methane, bis[4-(4-aminophenoxy)phenyl]sulfone, 2,2'-bis[4-(4-aminophenoxy)phenyl]perfluoropropane, etc.; and alkyl diamine compounds such as N,N-dimethyl-1,3-propanediamine, 5-pentanediamine, diethylenetriamine, (2-aminoethyl)-1,3-propanediamine, 3,3'-diamino-N-methyldipropylamine, (3-aminopropyl)-1,3-propanediamine, spermidine, spermidine trihydrochloride, (hexamethylene)triamine, 4,4'-methylene-bis (cyclohexylamine), 4'-methylene-bis(2-methylcyclohexylamine), 2,2'-(ethylenedioxy)-bis-9-ethylamine, 9-dioxa-1,12-dodecanediamine, 4,7,10-trioxa-1,13-tridecanediamine, 4-diaminopiperazine hydrochloride, etc.

The reaction of the diamine compound with carboxyl groups on the substrate is carried out, for example, by dissolving the diamine compound in 1 to 500M in a solvent, immersing the substrate in the solution at about 60° C. for 0.5 to 10 hours, and washing the substrate. Examples of the solvent which may be used at this process include, but is not limited to, N-methyl-2-pyrrolidone (NMP), dimethylacetamide (DMAc), dimethylformamide (DMF), cyclohexanone, etc.

Lamination of Carbon Nanotubes

The amino groups on the monolayer of the diamine compound are reacted with additional carboxylated carbon nanotubes in the presence of the coupling agent, to further laminate a carbon nanotube layer on the monolayer of the carbon nanotubes.

By repeating these processes of forming a diamine monolayer and subsequently reacting the diamine monolayer with additional carboxylated carbon nanotubes, carbon nanotubes can be laminated layer by layer, and finally a patterned multilayer of carbon nanotubes is formed.

In a third embodiment, there is provided a method for forming a carbon nanotube layer by laminating carbon nanotubes on the amine-treated substrate in the presence of the coupling agent using a chemical self-assembly process. According to the method of the third embodiment, adhesion between the carbon nanotubes and the substrate can be improved.

Surface Treatment of Substrate

The introduction of amino groups into the substrate is carried out in the same manner as in the first embodiment.

Lamination of Carbon Nanotubes

In the present embodiment, the amino groups on the substrate are directly reacted with carboxylated carbon nanotubes without a photolithographic process, to laminate a carbon nanotube monolayer on the substrate. This lamination of carbon nanotubes is carried out in the same manner as in the first embodiment.

At this point, O-(7-azabenzotriazol-1-yl)-N,N,N',N'-tetramethyluronium hexafluorophosphate may be used as a coupling agent, and N,N-diisopropylethylamine may be used as a catalyst for promoting the coupling reaction. The use of the coupling agent improves the adhesion between the carbon nanotube monolayer and the substrate surface, thereby stabilizing the physical properties of the carbon nanotube monolayer.

In a fourth embodiment, there is provided a method for forming a multilayer structure of carbon nanotubes on the carbon nanotube monolayer formed in the third embodiment using a chemical self-assembly process. In the present embodiment, formation of a diamine monolayer and reaction of the diamine monolayer with additional carbon nanotubes are repeatedly carried out in the same manner as in the second embodiment, to form a multilayer structure of carbon nanotubes.

Hereinafter, the present invention will be described in more detail with reference to the following Examples. However, these examples are given for the purpose of illustration and are not to be construed as limiting the scope of the invention.

EXAMPLE 1

Purification of Carbon Nanotubes 5 g of carbon nanotubes were dispersed in 700 ml of $HNO_3$ aqueous solution (2.6M) in a 2 L flask equipped with a reflux condenser, and then refluxed at 100° C. for 48 hours. The resulting mixture was centrifuged at 2000 rpm for 30 minutes to separate precipitates and a supernatant of acid solution. The supernatant was removed. Then, the precipitates were dispersed in distilled water, and centrifuged again to remove a supernatant. These series of processes were repeated three times or more. The finally washed precipitates were dispersed in an aqueous solution containing 5% by weight of Triton X-100, and the dispersion was adjusted to a pH of 10 or higher using sodium hydroxide (NaOH). Subsequently, the resulting mixture was subjected to a sonication process for 10 hours, and thereafter 10 g of hydrochloric acid (HCl) was added to precipitate single wall carbon nanotubes. The solution was centrifuged at 2,000 rpm for 30 minutes to separate an aqueous acid solution and the precipitates. The precipitates were passed through a membrane filter with a pore size of 1 $\mu$m and dried in a vacuum oven at 40° C. for 24 hours to provide purified single wall carbon nanotubes.

EXAMPLE 2

Cutting of Carbon Nanotubes 1 g of the carbon nanotubes obtained from Example 1 was sonicated in 100 ml of an acidic mixture of sulfuric acid and nitric acid (3:1 (v/v)) for 24 hours using a sonicator. The resulting solution was poured into 500 ml of distilled water, passed through a polycarbonate filter with a pore size of 0.1 $\mu$m, and dried under reduced pressure to fabricate carboxylated carbon nanotubes.

EXAMPLE 3

Formation of Carbon Nanotube Monolayer Structure

A glass substrate was immersed in an alcoholic solution of 0.1% (v/v) aminopropyltriethoxysilane, and the alcoholic solution was stirred at room temperature for 5 minutes. The glass substrate was washed by immersing it in ethyl alcohol three times, and dried in a vacuum oven at 120° C. for 20 minutes. After the dried glass substrate was held under argon gas atmosphere for 12 hours, it was immersed in DMF and sufficiently washed with dichloromethane. Next, 2 mg of the carboxylated carbon nanotubes obtained from Example 2 were dispersed in 200 ml of DMF using a sonicator. To the dispersion of the carbon nanotubes, 2 g of N,N-diisopropylethylamine (hereinafter, referred to as 'DIEA') was added dropwise followed by stirring for 10 minutes. Subsequently, 50 ml of DMF dissolving 2.5 g of O-(7-azabenzotriazol-1-yl)-N,N,N',N'-tetramethyluronium hexafluorophosphate (hereinafter, referred to as 'HATU') was added to the dispersion of the carbon nanotubes, followed by stirring for 20 minutes. The glass substrate was vertically immersed in the solution, and the reaction was continued at 60° C. for 6 hours. After the glass substrate was taken out of the solution, it was washed three times in a beaker containing 200 ml of DMF, each washing being conducted for 15 minutes. Subsequently, the glass substrate was washed three times in a beaker containing 200 ml of methylene chloride, each washing being conducted for 15 minutes. Then, the glass substrate was dried at 40° C. for 15 minutes to prepare a glass substrate on which the carbon nanotubes were laminated in a monolayer structure. FIG. 1 shows a SEM image of the substrate surface on which the carbon nanotubes are laminated once. The SEM image confirms that the carbon nanotube monolayer was formed on the glass substrate.

EXAMPLE 4

Formation of Carbon Nanotube Multilayer

Figure 6:
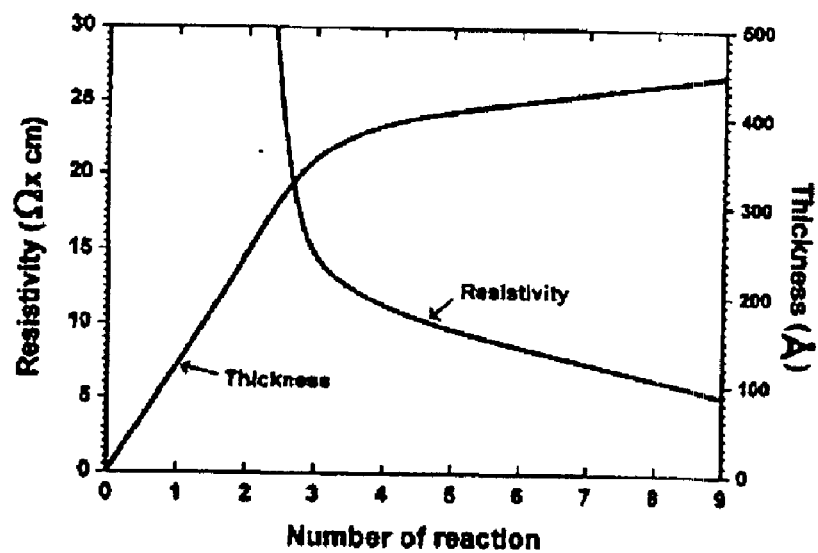
FIG. 6 is a graph showing a tendency that as the number of laminations of carbon nanotubes increases in Example 4 of the present invention, the thickness of carbon nanotubes on the substrate surface increases and electrical resistivity (specific resistance) decreases.

The glass substrate on which the carbon nanotube monolayer was formed, prepared in Example 3, was reacted in 200 ml of DMF containing 4 g of diaminophenyl ether at 60° C. for 2 hours. After the glass substrate was taken out of the solution, it was washed three times in a beaker containing 200 ml of DMF, each washing being conducted for 15 minutes. Subsequently, the glass substrate was washed three times in a beaker containing 200 ml of methylene chloride, each washing being conducted for 15 minutes, to prepare a glass substrate on which diaminophenyl ether was laminated in a monolayer structure on the carbon nanotube monolayer. Next, lamination of carbon nanotubes and washings were carried out in the same manner as in Example 3 to form a bilayer structure of carbon nanotubes on the substrate. The reaction with diaminophenyl ether and the subsequent washing, and the reaction with carbon nanotubes and the subsequent washing were repeated to form a multilayer structure of carbon nanotubes on the substrate. FIGS. 2 to 5 show SEM images of substrate surfaces on which carbon nanotubes are laminated twice, three times, six times and nine times, respectively. The electrical resistivity of the substrates was measured using a 4-point probe at each reaction point. As the number of carbon nanotube layers increased, changes in the thickness of carbon nanotubes on the substrate and the electrical resistivity were measured. The results are shown in FIG. 6.

EXAMPLE 5

Formation of Monolayer and Multilayer Carbon Nanotube Patterns

A glass substrate was immersed in an alcoholic solution of 0.1%(v/v) aminopropyltriethoxysilane and the alcoholic solution was stirred at room temperature for 5 minutes. The glass substrate was immersed in ethyl alcohol three times to wash the substrate, and dried in a vacuum oven at 120° C. for 20 minutes. Subsequently, the dried glass substrate was held under argon gas atmosphere for 12 hours, and immersed in DMF and then sufficiently washed with dichloromethane. Next, 1,3-dicyclohexylcarbodiimide (hereinafter, referred to as 'DCC') was added to DMF containing 6-(butoxycarbonyl-amino)caproic acid in a concentration of 25 mM, and the glass substrate was immersed therein. The solution was stirred at 40° C. for 4 hours.

A mixture of 0.3 g of diphenyliodonium hexafluroro antimonate as a photo-acid generator and a surfactant was spin-coated onto the glass substrate. After the coated glass substrate was dried at 100° C. for 2 minutes, it was exposed to UV light through a patterned photomask by means of a UV exposure equipment (exposure energy: 300 mJ/cm$^2$). After exposure, a post-exposure baking process was carried out at 100° C. for 2 minutes, and a pattern was developed using an aqueous TMAH solution (2.38%). The developed glass substrate was washed with ethanol, and dried at 40° C. for 15 minutes to form a patterned substrate. Carbon nanotubes were laminated on the patterned substrate and washed in the same manner as in Example 3, to form a patterned carbon nanotube layer.

Figure 7:
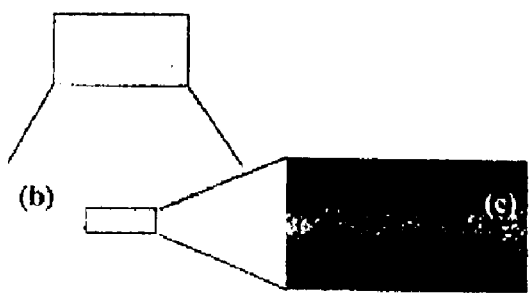
FIGS. 7a, 7b and 7c are optical microscopic images (FIGS. 7a and 7b) and a SEM image (FIG. 7c) of a carbon nanotube pattern in accordance with Example 5 of the present invention, respectively.

Next, the reaction with diaminophenyl ether and the subsequent washing, and the reaction with carbon nanotubes and the subsequent washing were repeated twice in the same manner as in Example 4, and the obtained glass substrate was dried in a vacuum oven at 40° C. for 15 minutes to form a carbon nanotube pattern in trilayer structure on the glass substrate. FIGS. 7a and 7b are optical microscopic images, and FIG. 7c is a SEM image of the carbon nanotube pattern thus formed.

Figure 8:
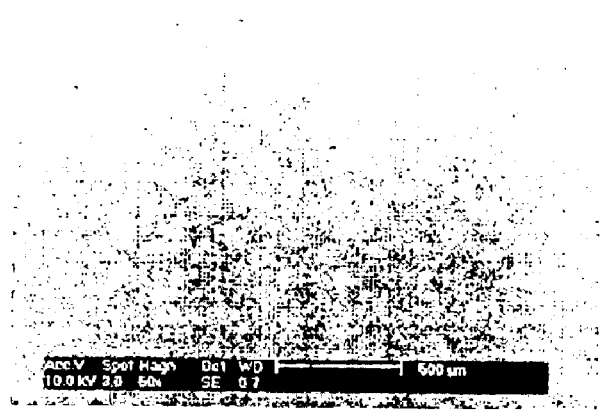
FIG. 8 is a SEM image of a pattern formed by patterning amine groups on a substrate surface into 80 μm squares, followed by laminating carbon nanotubes five times on the pattern, in accordance with Example 5 of the present invention.
Figure 9:
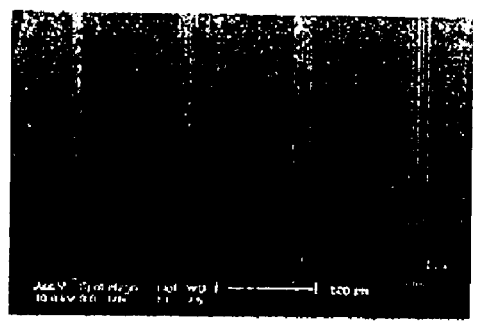
FIG. 9 is a SEM image of a pattern formed by patterning amine groups on a substrate surface into a line width of 1 to 4 μm, followed by laminating carbon nanotubes five times on the pattern, in accordance with Example 5 of the present invention.

A pattern is formed on squares having an area of 80×80 $\mu m^2$ (square), by forming a line/space pattern having a line width of 1 to 4 $\mu$m. The carbon nanotubes were laminated five times on the respective patterns in the same manner as described above to form carbon nanotube patterns of multilayer structure. FIG. 8 shows a SEM image of the pattern in which squares having an area of 80×80 $\mu m^2$ (square) were arranged. FIG. 9 shows a SEM image of the line/space patterns having a line width of 1 to 4 $\mu$m.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for forming a carbon nanotube pattern, comprising:

(a) surface treating a substrate to expose amino groups thereon;

(b) treating the surface-treated substrate with a linker of aminoalkylcarboxylic acid represented by the following formula 1:

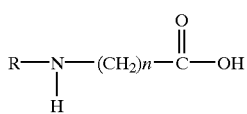

Formula 1 wherein R is a functional group capable of being dissociated by an acid, and n is an integer of 1 to 50, in the presence of a coupling agent to form amide bonds between the amino groups exposed on the substrate and the carboxyl groups of the aminoalkylcarboxylic acid;

(c) applying a photo-acid generator onto the substrate, irradiating UV light to the substrate through a patterned photomask, and developing with an alkaline developer to form a positive pattern on which reactive amino groups are exposed; and (d) reacting the reactive amino groups on the substrate with carboxylated carbon nanotubes in the presence of a coupling agent to form a carbon nanotube layer.

2. The method for forming a carbon nanotube pattern as claimed in claim 1, wherein after (d), (e) and (f) are performed one or more times to form a carbon nanotube pattern having a multilayer structure:

(e) reacting terminal carboxylic groups of the carbon nanotube pattern formed on the substrate, with an organic diamine compound, to form a diamine monolayer on the carbon nanotube pattern; and (f) reacting the diamine monolayer with additional carboxylated carbon nanotubes in the presence of a coupling agent, to form a carbon nanotube layer.

3. The method for forming a carbon nanotube pattern as claimed in claim 1, wherein the substrate is made of glass, a silicon wafer or plastic.

4. The method for forming a carbon nanotube pattern as claimed in claim 1, wherein in (a) or (b) the surface treatment of the substrate is carried out by coating an aminoalkylalkoxysilane or aminoarylalkoxysilane onto the surface of the substrate using a spin coating, a dip coating, a spray coating, a flow coating or a screen printing process, and drying under vacuum or inert atmosphere at 10 to 150° C.

5. The method for forming a carbon nanotube pattern as claimed in claim 1, wherein the coupling agent is at least one compound selected from the group consisting of 1,3-dicyclohexylcarbodiimide, 1-ethyl-3(3-dimethylaminopropyl)-carbodiimide, benzotriazol-1-yloxytris(dimethylamino) phosphonium hexafluorophosphate and O-(7-azabenzotriazol-1-yl)-N,N,N',N'-tetramethyluronium hexafluorophosphate.

6. The method for forming a carbon nanotube pattern as claimed in claim 1, wherein the coupling agent is used along with an alkyl or aryl amine compound as a catalyst.

7. The method for forming a carbon nanotube pattern as claimed in claim 1, wherein (b) is carried out by immersing the surface-treated substrate in a solution dissolving the linker in 1 to 500 mM and the coupling agent in 1 to 500 mM, and continuing a reaction at 10 to 100° C. for 0.5 to 15 hours.

8. The method for forming a carbon nanotube pattern as claimed in claim 1, wherein the group R is t-butoxycarbonyl group, trimethylsilyloxycarbonyl group, or —CHR$_1$—O—R$_2$ in which R$_1$ is hydrogen, a saturated or unsaturated hydrocarbon group having from 1 to 20 carbon atoms, or an organic aromatic group having from 1 to 20 carbon atoms, and R$_2$ is a saturated or unsaturated hydrocarbon group having from 1 to 20 carbon atoms, or an organic aromatic group having from 1 to 20 carbon atoms, and R$_1$ and R$_2$ are capable of being bonded to each other to form a cyclic compound.

9. The method for forming a carbon nanotube pattern as claimed in claim 1, wherein the photo-acid generator is at least one compound selected from the group consisting of ionic photo-acid generator including Ph$_2$I$^+$AsF$_6^-$, Ph$_2$I$^+$PF$_6^-$, Ph$_2$I$^+$TosO$^-$, Ph$_3$S$^+$SbF$_6^-$, Ph$_3$S$^+$TosO$^-$, Ph$_3$S$^+$TfO$^-$, RO—C$_6$H$_4$—N$_2^+$SbF$_6^-$ and diphenyl iodonium salts of aromatic sulfonic acids having at least one hydroxyl group; non-ionic photo-acid generators including DNQ (diazonaphthoquinone) compounds and nitrobenzylsulfonic adds; and polymeric photo-acid generators.

10. The method for forming a carbon nanotube pattern as claimed in claim 2, wherein in (d) and (f) the reaction of the carboxylated carbon nanotubes with the amino groups of the substrate is carried out by mixing the coupling agent in 1 to 500 mM with a dispersion liquid containing 0.00001 to 1% by weight of the carboxylated carbon nanotubes, immersing the substrate in the mixture, continuing a reaction at 10 to 100° C. for 0.5 to 15 hours, and washing the substrate.

11. The method for forming a carbon nanotube pattern as claimed in claim 2, wherein the coupling agent is at least one compound selected from the group consisting of 1,3-dicyclohexylcarbodiimide, 1-ethyl-3(3-dimethylaminopropyl)-carbodiimide, benzotriazol-1-yloxytris(dimethylamino) phosphonium hexafluorophosphate and O-(7-azabenzotriazol-1-yl)-N,N,N',N'-tetramethyluronium hexafluorophosphate.

12. The method for forming a carbon nanotube pattern as claimed in claim 11, wherein the coupling agent is used along with an alkyl or aryl amine compound as a catalyst.

13. The method for forming a carbon nanotube pattern as claimed in claim 2, wherein the diamine compound is an aromatic diamine compound selected from the group consisting of 1,3-diamino-4-dihydroxybenzene, 1,3-diamino-5-dihydroxybenzene, 3,3'-diamino-4,4'-dihydroxybiphenyl, 4,4'-diamino-3,3'-dihydroxybiphenyl, 2,2-bis(3-amino-4-hydroxyphenyl)propane, bis(4-amino-3-hydroxyphenyl) sulfone, bis(3-amino-4-hydroxyphenyl)sulfone, bis(3-amino-4-hydroxyphenyl)ether, bis(4-amino-3-hydroxyphenyl)ether, 2,2-bis(3-amino-4-hydroxyphenyl) hexafluoropropane, 2,2-bis(4-amino-3-hydroxyphenyl) hexafluoropropane, m-phenylenediamine, p-phenylenediamine, 4,4'-diaminediphenylmethane, 4,4'-diaminediphenylether, 2,2'-bis(4-aminophenyl) propane, 4,4'-diaminophenylsulfone, 3,3'-4,4'-diaminodiphenylsulfone, 4,4'-diaminodiphenylsulfone, 1,4-bis(3-aminophenoxy)benzene, 1,4-bis(4-aminophenoxy)benzene, 1,4-bis(p-aminophenylsulfonyl)benzene, 1,4-bis(m-aminophenylsulfonyl)benzene, 2,2-bis[4-(4-aminophenoxy)phenyl]propane, bis[4-(4-aminophenoxy)phenyl]methane, bis[3,5-dimethyl-4-(4-aminophenoxy)phenyl]methane, bis[4-(4-aminophenoxy)phenyl]sulfone and 2,2'-bis[4-(4-aminophenoxy) phenyl]perfluoropropane; or an alkyl diamine compound selected from the group consisting of N,N-dimethyl-1,3-propanediamine, 5-pentanediamine, diethylenetriamine, (2-aminoethyl)-1,3-propanediamine, 3,3'-diamino-N-methyldipropylamine, (3-aminopropyl)-1,3-propanediamine, spermidine, spermidine trihydrochloride, (hexamethylene)triamine, 4,4'-methylene-bis(cyclohexylamine), 4'-methylene-bis(2-methylcyclohexylamine), 2,2'-(ethylenedioxy)-bis-9-ethylamine, 9-dioxa-1,12-dodecanediamine, 4,7,10-trioxa-1,13-tridecanediamine and 4-diaminopiperazine hydrochloride.

14. A method for forming a carbon nanotube layer, comprising:

(a) surface treating a substrate to expose amino groups thereon; and (b) reacting the amino groups of the substrate with carboxylated carbon nanotubes in the presence of a coupling agent and a catalyst to form a carbon nanotube layer, wherein the coupling agent is O-(7-azabenzotriazol-1-yl)-N,N,N',N'-tetramethyluronium hexafluorophosphate and the catalyst is alkyl or aryl amine.

15. The method for forming a carbon nanotube pattern as claimed in claim 14, wherein after (b), (c) and (d) are performed one or more times to form a multilayer carbon nanotube:

(c) reacting terminal carboxylic groups of the carbon nanotube layer formed on the substrate, with an organic diamine compound, to form a diamine monolayer on the carbon nanotube layer; and (d) reacting the diamine monolayer with additional carboxylated carbon nanotubes in the presence of a coupling agent, to form a carbon nanotube layer.

16. The method for forming a carbon nanotube pattern as claimed in claim 14, wherein the substrate is made of glass, a silicon wafer or plastic.

17. The method for forming a carbon nanotube pattern as claimed in claim 14, wherein in (a) the surface treatment of the substrate is carried out by coating an aminoalkylalkoxysilane or aminoarylalkoxysilane onto the surface of the substrate using a spin coating, a dip coating, a spray coating, a flow coating or a screen printing process, and drying under vacuum or inert atmosphere at 10 to 150° C.

18. The method for forming a carbon nanotube pattern as claimed in claim 15, wherein in (b) and (d), the reaction of the carboxylated carbon nanotubes with the amino groups of the substrate is carried out by mixing the coupling agent in 1 to 500 mM with a dispersion liquid containing 0.00001 to 1% by weight of the carboxylated carbon nanotubes, immersing the substrate in the mixture, continuing a reaction at 10 to 10° C. for 0.5 to 15 hours, and washing the substrate.

19. The method for forming a carbon nanotube pattern as claimed in claim 15, wherein the diamine compound is an aromatic diamine compound selected from the group consisting of 1,3-diamino-4-dihydroxybenzene, 1,3-diamino-5-dihydroxybenzene, 3,3'-diamino-4,4'-dihydroxybiphenyl, 4,4'-diamino-3,3'-dihydroxybiphenyl, 2,2-bis(3-amino-4-hydroxyphenyl)propane, bis(4-amino-3-hydroxyphenyl) sulfone, bis(3-amino-4-hydroxyphenyl)sulfone, bis(3-amino-4-hydroxyphenyl)ether, bis(4-amino-3-hydroxyphenyl)ether, 2,2-bis(3-amino-4-hydroxyphenyl) hexafluoropropane, 2,2-bis(4-amino-3-hydroxyphenyl) hexafluoropropane, m-phenylenediamine, p-phenylenediamine, 4,4'-diaminediphenylmethane, 4,4'-diaminediphenylether, 2,2'-bis(4-aminophenyl) propane, 4,4'-diaminophenylsulfone, 3,3'-4,4'-diaminodiphenylsulfone, 4,4'-diaminodiphenylsulfone, 1,4-bis(3-aminophenoxy)benzene, 1,4-bis(4-aminophenoxy) benzene, 1,4-bis(p-aminophenylsulfonyl)benzene, 1,4-bis(m-aminophenylsulfonyl)benzene, 2,2-bis[4-(4-aminophenoxy)phenyl]propane, bis[4-(4-aminophenoxy) phenyl]methane, bis[3,5-dimethyl-4-(4-aminophenoxy) phenyl]methane, bis[4-(4-aminophenoxy)phenyl]sulfone and 2,2'-bis[4-(4-aminophenoxy)phenyl)-perfluoropropane; or an alkyl diamine compound selected from the group consisting of N,N-dimethyl-1,3-propanediamine, 5-pentanediamine, diethylenetriamine, (2-aminoethyl)-1,3-propanediamine, 3,3'-diamino-N-methyldipropylamine, (3-aminopropyl-1,3-propanediamine, spermidine, spermidine trihydrochloride, (hexamethylene)triamine, 4,4'-methylene-bis(cyclohexylamine), 4'-methylene-bis(2-methylcyclohexylamine), 2,2'-(ethylenedioxy)-bis-9-ethylamine, 9-dioxa-1,12-dodecanediamine, 4,7,10-trioxa-1,13-tridecanediamine and 4-diaminopiperazine hydrochloride.

20. The method for forming a carbon nanotube pattern as claimed in claim 15, wherein the coupling agent is at least one compound selected from the group consisting of 1,3-dicyclohexylcarbodiimide, 1-ethyl-3(3-dimethylaminopropyl]carbodiimide, benzotriazol-1-yloxytris(dimethylamino) phosphonium hexafluorophosphate and O-(7-azabenzotriazol-1-yl)-N,N,N',N'-tetramethyluronium hexafluorophosphate.

21. The method for forming a carbon nanotube pattern as claimed in claim 20, wherein the coupling agent is used along with an alkyl or aryl amine compound as a catalyst.

* * * * *